US011113445B2

(12) United States Patent
Park et al.

(10) Patent No.: US 11,113,445 B2
(45) Date of Patent: Sep. 7, 2021

(54) HOTSPOT DETECTION BASED ON LITHO-AWARE MACHINE LEARNING

(71) Applicant: Mentor Graphics Corporation, Wilsonville, OR (US)

(72) Inventors: Jea Woo Park, Wilsonville, OR (US); Juan Andres Torres Robles, Wilsonville, OR (US)

(73) Assignee: Siemens Industry Software Inc., Plano, TX (US)

( * ) Notice: Subject to any disclaimer, the term of this patent is extended or adjusted under 35 U.S.C. 154(b) by 365 days.

(21) Appl. No.: 16/135,236

(22) Filed: Sep. 19, 2018

(65) Prior Publication Data

US 2019/0087526 A1 Mar. 21, 2019

Related U.S. Application Data

(60) Provisional application No. 62/560,913, filed on Sep. 20, 2017.

(51) Int. Cl.
*G06F 30/398* (2020.01)
*G06F 30/18* (2020.01)
(Continued)

(52) U.S. Cl.
CPC .......... *G06F 30/398* (2020.01); *G03F 7/705* (2013.01); *G03F 7/70433* (2013.01);
(Continued)

(58) Field of Classification Search
CPC .... G06F 30/398; G03F 7/705; G03F 7/70433; G06N 20/00
See application file for complete search history.

(56) References Cited

U.S. PATENT DOCUMENTS

2012/0054694 A1* 3/2012 Hamouda ............... G03F 7/705
716/53
2013/0031522 A1* 1/2013 Robles .................. G06F 30/398
716/112
(Continued)

OTHER PUBLICATIONS

J. W. Park, A. Torres and X. Song, "Litho-Aware Machine Learning for Hotspot Detection," in IEEE Transactions on Computer-Aided Design of Integrated Circuits and Systems, vol. 37, No. 7, pp. 1510-1514, Jul. 2018, doi: 10.1109/TCAD.2017.2750068. (Year: 2017).*

(Continued)

*Primary Examiner* — Omar F Fernandez Rivas
*Assistant Examiner* — Pursottam Giri

(57) ABSTRACT

Aspects of the disclosed technology relate to techniques of hotspot detection. Pinching-type hotspot candidates and bridging-type hotspot candidates are first identified in the layout design based on predetermined criteria. Simulation is then performed to derive aerial image intensity values for a plurality of sites on each of the pinching-type and bridging-type hotspot candidates. Pinching-type hotspots are determined from the pinching-type hotspot candidates based on one or more machine learning models for pinching-type hotspots, and bridging-type hotspots are determined from the bridging-type hotspot candidates based on one or more machine learning models for bridging-type hotspots. The input vector for the machine learning models is the aerial image intensity values for the plurality of sites.

15 Claims, 10 Drawing Sheets

Flow chart
400

(51) Int. Cl.
  G03F 7/20    (2006.01)
  G06N 20/00   (2019.01)
  G06F 30/20   (2020.01)
  G06N 20/10   (2019.01)

(52) U.S. Cl.
  CPC ............ *G06F 30/18* (2020.01); *G06N 20/00* (2019.01); *G06F 30/20* (2020.01)

(56) References Cited

U.S. PATENT DOCUMENTS

| | | | |
|---|---|---|---|
| 2015/0040080 A1* | 2/2015 | Hamouda | G06F 30/39 716/53 |
| 2016/0125120 A1* | 5/2016 | Yu | G06F 30/398 716/52 |
| 2016/0321793 A1* | 11/2016 | Chang | G06K 9/4604 |

OTHER PUBLICATIONS

Park, Jea Woo, "Lithography Hotspot Detection" ( Jul. 21, 2017). Dissertations and Theses. Paper 3781. https://doi.org/10.15760/etd.5665 (Year: 2017).*

Toshiya et al., "Automatic layout feature extraction for lithography hotspot detection based on deep neural network" SPIE Advanced Lithography, 2016, San Jose, California, United States (Year: 2016).*

H. Zhang / "Enabling online learning in lithography hotspot detection with information-theoretic feature optimization." ICCAD, 2016, pp. 1-8.

H. Yang / "Imbalance aware lithography hotspot detection: A deep learning approach." SPIE, 2017.

A. Torres / "Iccad-2012 cad contest in fuzzy pattern matching for physical verification and benchmark suite." ICCAD Special session, 2012.

S. Lin / "A novel fuzzy matching model for lithography hotspot detection." DAC, 2012, pp. 1-6.

Y.-T. Yu /"Machine-learning-based hotspot detection using topological classification and critical feature extraction," IEEE TCAD, vol. 34, pp. 460-470, 2015.

J. Wuu / "Rapid layout pattern classification." ASP-DAC, 2011, pp. 781-786.

J. Gao, / "Accurate lithography hotspot detection based on pcasvm clas-sifier with hierarchical data clustering," vol. 9053. SPIE 2014.

D. Ding / "Machine learning based lithographic hotspot detection with critical feature extraction and classification." ICICDT, 2009, pp. 219-222.

D. Ding / "High performance lithographic hotspot detection using hier-archically refined machine learning." ASP-DAC 2011, pp. 775-780.

* cited by examiner

| Testing layout(Training data) | Methods | #bit | #extra | accuracy | false alarm (#extra /#area) | runtime | area(um²) |
|---|---|---|---|---|---|---|---|
| Array_benchmark1 (MX_benchmark1_clip) | 1st place | 212 | 1,826 | 93.81% | 0.15 | 6m05.1s | 12,516 |
| | [17] | 226 | 788 | 100% | 0.06 | 6m10s | |
| | [16] | 225 | 147 | 99.56% | 0.01 | 6m51s | |
| | [11] | 183 | 3,356 | 82.10% | 0.27 | 6m14.4s | |
| | [21] | 214 | 1,416 | 94.69% | 0.11 | 1m01.6s | |
| | Ours | 225 | 469 | 99.56% | 0.04 | 2m43.1s | |
| MX_blind_partial (MX_benchmark1_clip) | 1st place | 51 | 66,818 | 92.73% | 0.30 | 2m31.7s | 224,974 |
| | [21] | 51 | 49,343 | 92.73% | 0.22 | 2m10.6s | |
| | ours | 55 | 27,880 | 100.00% | 0.12 | 12m44.3s | |
| Array_benchmark2 (MX_benchmark2_clip) | 1st place | 489 | 20,383 | 98.00% | 0.19 | 8m11.9s | 106,954 |
| | [17] | 496 | 544 | 99.40% | 0.01 | 1m43s | |
| | [16] | 498 | 561 | 98.80% | 0.01 | 6m30s | |
| | [11] | 385 | 1,842 | 75.80% | 0.02 | 3m04.8s | |
| | [21] | 480 | 10,761 | 98.20% | 0.10 | 1m02.7s | |
| | Ours | 489 | 1,296 | 100.00% | 0.01 | 13m58.4s | |
| Array_benchmark3 (MX_benchmark3_clip) | 1st place | 1,696 | 20,764 | 91.82% | 0.17 | 18m44.0s | 122,565 |
| | [17] | 1,801 | 2,052 | 97.51% | 0.02 | 1m56s | |
| | [16] | 1,808 | 2,660 | 97.78% | 0.02 | 7m14s | |
| | [11] | 1,271 | 2,407 | 68.80% | 0.02 | 4m07.0s | |
| | [21] | 1,697 | 13,025 | 91.88% | 0.11 | 12m24.9s | |
| | Ours | 1,838 | 2,938 | 99.40% | 0.02 | 16m27.0s | |
| Array_benchmark4 (MX_benchmark4_clip) | 1st place | 161 | 3,726 | 83.85% | 0.05 | 1m15.9s | 82,010 |
| | [17] | 187 | 3,341 | 97.74% | 0.04 | 1m9s | |
| | [16] | 185 | 1,785 | 96.40% | 0.02 | 5m34s | |
| | [11] | 138 | 1,488 | 72.00% | 0.02 | 1m43.3s | |
| | [21] | 165 | 3,437 | 85.94% | 0.04 | 5m29.1s | |
| | Ours | 187 | 3,423 | 97.40% | 0.04 | 5m37.5s | |
| Array_benchmark5 (MX_benchmark5_clip) | 1st place | 39 | 2,014 | 92.86% | 0.04 | 0m26.6s | 49,583 |
| | [17] | 40 | 94 | 95.12% | 0.00 | 0m41s | |
| | [16] | 40 | 245 | 95.12% | 0.00 | 3m52s | |
| | [11] | 28 | 444 | 63.40% | 0.01 | 0m44.6s | |
| | [21] | 39 | 1,111 | 92.86% | 0.02 | 0m07.8s | |
| | Ours | 42 | 700 | 100.00% | 0.01 | 3m34.5s | |

FIG. 10

HOTSPOT DETECTION BASED ON LITHO-AWARE MACHINE LEARNING

RELATED APPLICATIONS

This application claims the benefit of U.S. Provisional Patent Application No. 62/560,913, filed on Sep. 20, 2017, and naming Jea Woo Park et al. as inventors, which application is incorporated entirely herein by reference.

FIELD OF THE DISCLOSED TECHNOLOGY

The present disclosed technology relates to the field of circuit layout design verification and processing. Various implementations of the disclosed technology may be particularly useful for hotspot detection.

BACKGROUND OF THE DISCLOSED TECHNOLOGY

As feature sizes in chip design and semiconductor manufacturing technology node scale down further, the industry is being faced with a great challenge to cope with the sub-wavelength lithography gap. Even with various sophisticated techniques such as resolution enhancement techniques (RETs), multi-pattern lithography (MPL), and design for manufacturing (DFM), semiconductor manufacturing process will often run into lithography hotspots. Here, a hotspot is a layout pattern that may induce printability issues in lithography process. A pinching-type hotspot can result in an open or pinching defect and a bridging-type hotspot can lead to a bridge defect.

Lithography simulation has been used to find hotspots. While accurate, it is too computationally expensive in the full-chip scale. Pattern matching and machine learning-based techniques can be adopted to reduce high computational complexity and to enable design verification at an early design phase, but both have their limitations Pattern matching can be performed using various techniques, which include string-based pattern matching, DRC-based pattern matching, explicit model-based pattern matching, and pattern skeleton encoding-based pattern matching. These pattern matching techniques have been employed by the industry as alternative hotspot detection to the rigorous lithography simulation. Having shown reasonable success, pattern matching has an intrinsic shortcoming: it is difficult to recognize previously unseen hotspots. Hotspot pattern library for pattern matching cannot cover all possible hotspots even if fuzzy pattern matching is employed.

Machine learning (ML) can identify previously unseen hotspots when it is well trained, and the characterization input vector is relevant to the problem. Previously-reported machine learning techniques for hotspot detection typically use a supervised learning model, e.g., artificial neural network (ANN), deep convolutional neural network (CNN), boosting algorithm, or support vector model (SVM). Recent research involves hierarchical learning, data clustering, fuzzy cluster growing, and topological classification and critical feature extraction. All of these techniques, however, suffer from too many false alarms if a certain accuracy of real hotspot detection needs to be achieved.

BRIEF SUMMARY OF THE DISCLOSED TECHNOLOGY

Aspects of the disclosed technology relate to techniques of machine-learning-based hotspot detection. In one aspect, there is a method comprising: receiving a layout design; identifying pinching-type hotspot candidates and bridging-type hotspot candidates in the layout design based on predetermined criteria; performing simulation to derive aerial image intensity values for a plurality of sites on each of the pinching-type hotspot candidates and for a plurality of sites on each of the bridging-type hotspot candidates; determining pinching-type hotspots from the pinching-type hotspot candidates based on one or more machine learning models for pinching-type hotspots and bridging-type hotspots from the bridging-type hotspot candidates based on one or more machine learning models for bridging-type hotspots, the input for the one or more machine learning models for pinching-type hotspots being the aerial image intensity values for the plurality of sites on each of the pinching-type hotspot candidates, the input for the one or more machine learning models for bridging-type hotspots being the aerial image intensity values for the plurality of sites on each of the bridging-type hotspot candidates; and storing information of the pinching-type hotspots and the bridging-type hotspots.

The method may further comprise: processing the layout design to repair some or all of the pinching-type hotspots and the bridging-type hotspots.

The one or more machine learning models for pinching-type hotspots may comprise a machine learning model for horizontal pinching-type hotspots and a machine learning model for vertical pinching-type hotspots, the one or more machine learning models for bridging-type hotspots may comprise a machine learning model for horizontal bridging-type hotspots and a machine learning model for vertical bridging-type hotspots, the pinching-type hotspot candidates may be separated into a group of horizontal pinching-type hotspot candidates and a group of vertical pinching-type hotspot candidates, and the bridging-type hotspot candidates may be separated into a group of horizontal bridging-type hotspot candidates and a group of vertical bridging-type hotspot candidates.

The one or more machine learning models for pinching-type hotspots and the one or more machine learning models for bridging-type hotspots may be C-type Support Vector Machine models. The number of the plurality of sites may be greater than 8 and less than 20. The predetermined criteria may be set according to design checking rules.

In another aspect, there is one or more computer-readable media storing computer-executable instructions for causing one or more processors to perform the above method.

In still another aspect, there is a system, comprising: one or more processors, the one or more processors programmed to perform the above method.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed technology. Thus, for example, those skilled in the art will recognize that the disclosed technology may be embodied or carried out in a manner that achieves or optimizes one advantage or group of advantages as taught herein without necessarily achieving other objects or advantages as may be taught or suggested herein.

BRIEF DESCRIPTION OF THE DRAWINGS

FIG. 10 illustrates a table comparing results derived according to one embodiment of the disclosed technology with the ones derived by the winners of the 2012 CAD contest.

DETAILED DESCRIPTION OF THE DISCLOSED TECHNOLOGY

General Considerations

Figure 1:
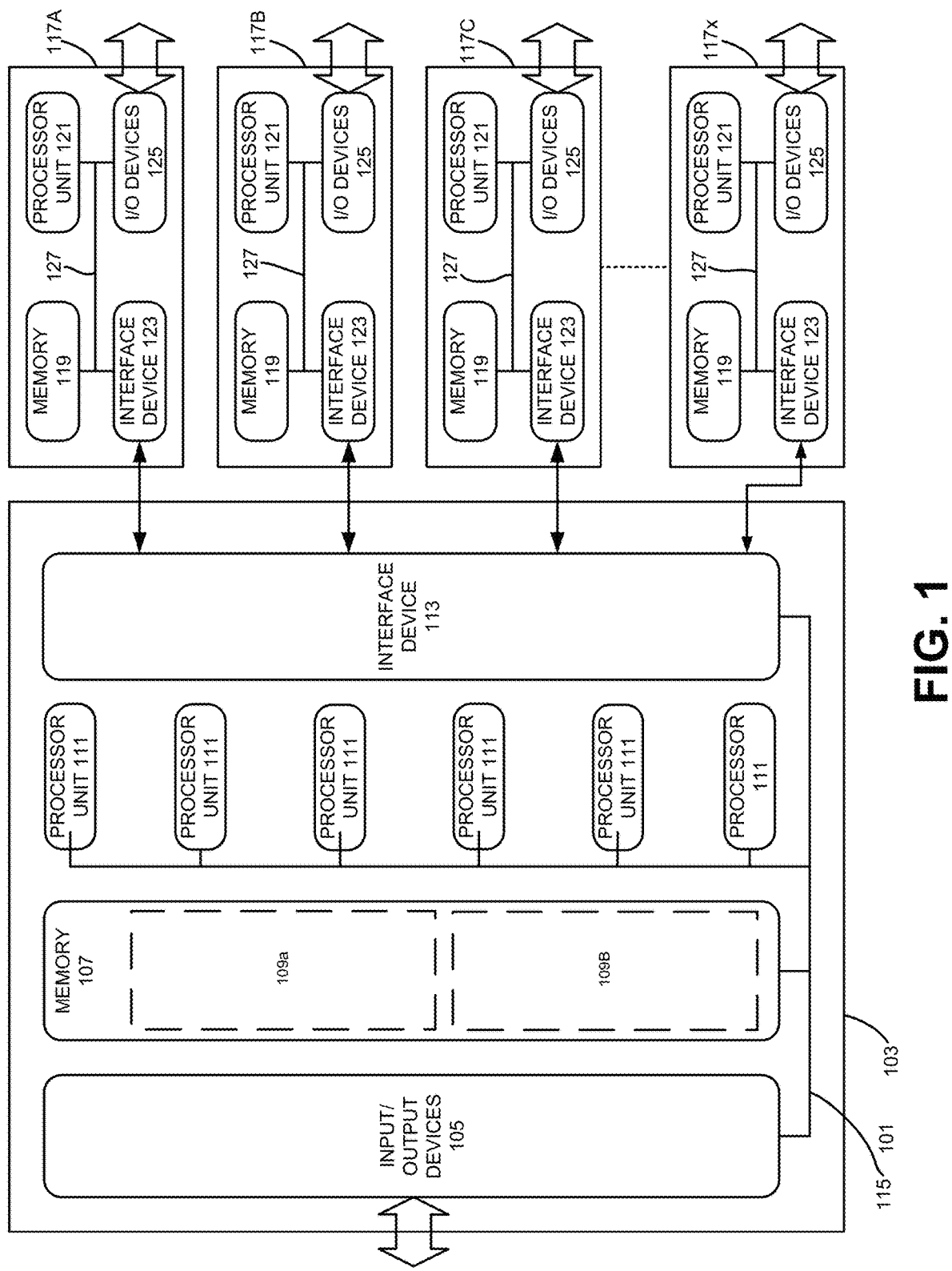
FIG. 1 illustrates an example of a computing system that may be used to implement various embodiments of the disclosed technology.

Various aspects of the present disclosed technology relate to techniques of machine-learning-based hotspot detection. In the following description, numerous details are set forth for the purpose of explanation. However, one of ordinary skill in the art will realize that the disclosed technology may be practiced without the use of these specific details. In other instances, well-known features have not been described in detail to avoid obscuring the present disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "perform", "identify," and "determine" to describe the disclosed methods. Such terms are high-level abstractions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one micro device, such as data to be used to form multiple micro devices on a single wafer.

Illustrative Operating Environment

The execution of various electronic design automation processes according to embodiments of the disclosed technology may be implemented using computer-executable software instructions executed by one or more programmable computing devices. Because these embodiments of the disclosed technology may be implemented using software instructions, the components and operation of a generic programmable computer system on which various embodiments of the disclosed technology may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the disclosed technology.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the disclosed technology. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
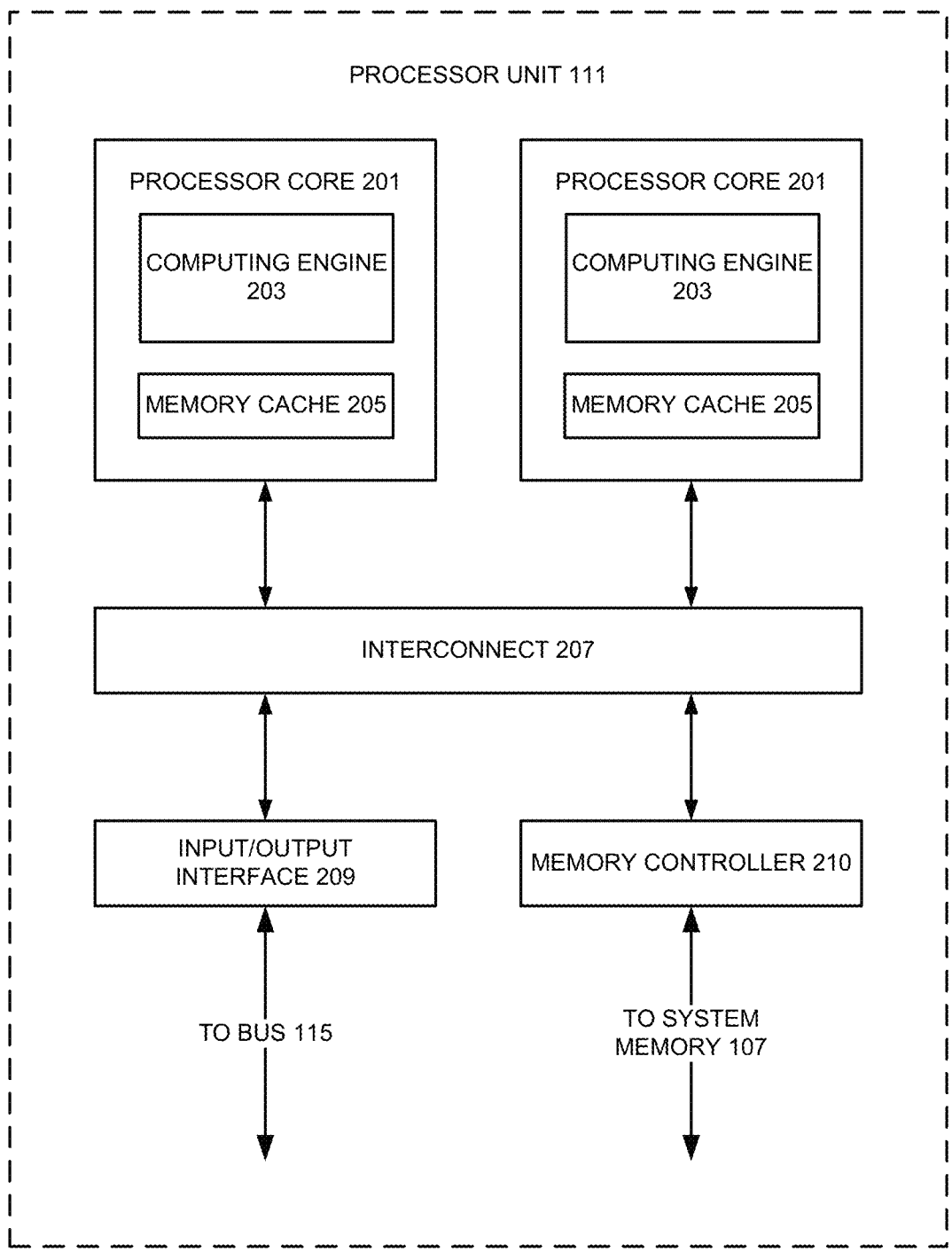
FIG. 2 illustrates an example of a multi-core processor unit that may be used to implement various embodiments of the disclosed technology.

With some implementations of the disclosed technology, the master computing device 103 may employ one or more processing units 111 having more than one processor core. Accordingly, FIG. 2 illustrates an example of a multi-core processor unit 111 that may be employed with various embodiments of the disclosed technology. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 111. With some processor cores 201, such as the Cell microprocessor created by Sony Corporation, Toshiba Corporation and IBM Corporation, the interconnect 207 may be implemented as an interconnect bus. With other processor units 111, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 210. The input/output interface 209 provides a communication interface between the processor unit 111 and the bus 115. Similarly, the memory controller 210 controls the exchange of information between the processor unit 111 and the system memory 107. With some implementations of the disclosed technology, the processor units 111 may include additional components, such as a high-level cache memory accessible shared by the processor cores 201.

While FIG. 2 shows one illustration of a processor unit 111 that may be employed by some embodiments of the disclosed technology, it should be appreciated that this illustration is representative only, and is not intended to be limiting. Also, with some implementations, a multi-core processor unit 111 can be used in lieu of multiple, separate processor units 111. For example, rather than employing six separate processor units 111, an alternate implementation of the disclosed technology may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the disclosed technology, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the disclosed technology may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the disclosed technology, either the computer 103, one or more of the servant computers 117, or some combination of both may use two or more different interface devices 113 or 123 for communicating over multiple communication interfaces.

With various examples of the disclosed technology, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the disclosed technology, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the disclosed technology.

Circuit Design, Verification, And Fabrication

Electronic circuits, such as integrated microcircuits, are used in a variety of products, from automobiles to microwaves to personal computers. Designing and fabricating integrated circuit devices typically involves many steps, sometimes referred to as a "design flow." The particular steps of a design flow often are dependent upon the type of integrated circuit, its complexity, the design team, and the integrated circuit fabricator or foundry that will manufacture the microcircuit. Typically, software and hardware "tools" verify the design at various stages of the design flow by running software simulators and/or hardware emulators. These steps aid in the discovery of errors in the design, and allow the designers and engineers to correct or otherwise improve the design.

Several steps are common to most design flows. Initially, the specification for a new circuit is transformed into a logical design, sometimes referred to as a register transfer level (RTL) description of the circuit. With this logical design, the circuit is described in terms of both the exchange of signals between hardware registers and the logical operations that are performed on those signals. The logical design typically employs a Hardware Design Language (HDL), such as the Very high speed integrated circuit Hardware Design Language (VHDL). The logic of the circuit is then analyzed, to confirm that it will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices (such as transistors, resistors, and capacitors) that will be used in the circuit, along with their interconnections. This device design generally corresponds to the level of representation displayed in conventional circuit diagrams. The relationships between the electronic devices are then analyzed, to confirm that the circuit described by the device design will correctly perform the desired functions. This analysis is sometimes referred to as "formal verification." Additionally, preliminary timing estimates for portions of the circuit are often made at this stage, using an assumed characteristic speed for each device, and incorporated into the verification process.

Once the components and their interconnections are established, the design is again transformed, this time into a physical design that describes specific geometric elements. This type of design often is referred to as a "layout" design. The geometric elements, which typically are polygons, define the shapes that will be created in various layers of material to manufacture the circuit. Typically, automated place and route tools will be used to define the physical layouts, especially of wires that will be used to interconnect the circuit devices. Each layer of the microcircuit will have a corresponding layer representation in the layout design, and the geometric shapes described in a layer representation will define the relative locations of the circuit elements that will make up the circuit device. For example, shapes in the layer representation of a metal layer will define the locations of the metal wires used to connect the circuit devices. Custom layout editors, such as Mentor Graphics' IC Station or Cadence's Virtuoso, allow a designer to custom design the layout, which is mainly used for analog, mixed-signal, RF, and standard-cell designs.

Integrated circuit layout descriptions can be provided in many different formats. The Graphic Data System II (GDSII) format is a popular format for transferring and archiving two-dimensional graphical IC layout data. Among other features, it contains a hierarchy of structures, each structure containing layout elements (e.g., polygons, paths or poly-lines, circles and textboxes). Other formats include an open source format named Open Access, Milkyway by Synopsys, Inc., EDDM by Mentor Graphics, Inc., and the more recent Open Artwork System Interchange Standard (OASIS) proposed by Semiconductor Equipment and Materials International (SEMI). These various industry formats are used to define the geometrical information in IC layout designs that are employed to manufacture integrated circuits. Once the microcircuit device design is finalized, the layout portion of the design can be used by fabrication tools to manufacture the device using a photolithographic process.

Typically, a designer will perform a number of verification processes on the layout design. For example, the layout design may be analyzed to confirm that it accurately represents the circuit devices and their relationships described in the device design. In this process, a LVS (layout versus schematic) tool extracts a netlist from the layout design and compares it with the netlist taken from the circuit schematic. LVS can be augmented by formal equivalence checking, which checks whether two circuits perform exactly the same function without demanding isomorphism.

The layout design also may be analyzed to confirm that it complies with various design requirements, such as minimum spacings between geometric elements and minimum linewidths of geometric elements. In this process, a DRC (design rule checking) tool takes as input a layout in the GDSII standard format and a list of rules specific to the semiconductor process chosen for fabrication. A set of rules for a particular process is referred to as a run-set, rule deck, or just a deck. An example of the format of a rule deck is the Standard Verification Rule Format (SVRF) by Mentor Graphics Corporation.

There are many different fabrication processes for manufacturing a circuit, but most processes include a series of steps that deposit layers of different materials on a substrate, expose specific portions of each layer to radiation, and then etch the exposed (or non-exposed) portions of the layer away. For example, a simple semiconductor device component could be manufactured by the following steps. First, a positive type epitaxial layer is grown on a silicon substrate through chemical vapor deposition. Next, a nitride layer is deposited over the epitaxial layer. Then specific areas of the nitride layer are exposed to radiation, and the exposed areas are etched away, leaving behind exposed areas on the epitaxial layer, (i.e., areas no longer covered by the nitride layer). The exposed areas then are subjected to a diffusion or ion implantation process, causing dopants, for example phosphorus, to enter the exposed epitaxial layer and form charged wells. This process of depositing layers of material on the substrate or subsequent material layers, and then exposing specific patterns to radiation, etching, and dopants or other diffusion materials, is repeated a number of times, allowing the different physical layers of the circuit to be manufactured.

Each time that a layer of material is exposed to radiation, a mask must be created to expose only the desired areas to the radiation, and to protect the other areas from exposure. The mask is created from circuit layout data. That is, the geometric elements described in a design layout define the relative locations or areas of the circuit that will be exposed to radiation through the mask. A mask or reticle writing tool is used to create the mask based upon the design layout, after which the mask can be used in a photolithographic process.

As designers and manufacturers continue to increase the number of circuit components in a given area and/or shrink the size of circuit components, the shapes reproduced on the substrate (and thus the shapes in the mask) become smaller and are placed closer together. This reduction in feature size increases the difficulty of faithfully reproducing the image intended by the design layout onto the substrate. The diffractive effects of light often result in defects where the intended image is not accurately "printed" onto the substrate during the photolithographic process, creating flaws in the manufactured device. One or more resolution enhancement techniques (RETs) are often employed to improve the resolution of the image that the mask forms on the substrate during the photolithographic process. Examples of various resolution enhancement techniques are discussed in "Resolution Enhancement Technology: The Past, the Present, and Extensions for the Future," Frank M. Schellenberg, Optical Microlithography XVII, edited by Bruce W. Smith, Proceedings of SPIE Vol. 5377, which article is incorporated entirely herein by reference. One of these techniques, "optical proximity correction" or "optical process correction" (OPC), adjusts the amplitude of the light transmitted through a lithographic mask by modifying the design layout data employed to create the mask.

As the technology node advances further, the traditional single exposure lithography is no longer a viable technique. At the 20 nm node, semiconductor manufacturers have adopted double patterning lithography techniques. A common form of double patterning lithography decomposes a layout design into two portions for two masks. The decomposition process is often referred to as coloring, i.e., the mask layers are assigned colors. The two masks are used in two separate exposure processes with the existing 193 nm water immersion lithography. The two coarser patterns formed are combined and superimposed, which enables a single finer image on the wafer. This form of double patterning is sometimes called pitch splitting, or more directly referred to as "LELE" (Litho-Etch-Litho-Etch).

As noted previously, a processed layout design can still have printability issues despite applying various techniques such as design rule checking, optical proximity correction and double patterning. A region of a layout design (a layout pattern) that may induce printability issues in lithography process and have poor printability is referred to as a hotspot. Two most common types of hotspots are bridging-type hotspots (hotspots that can cause bridging defects) and pinching-type hotspots (hotspots that can cause open or pinching defects). Hotspots may also include layout patterns for line-end pullback or overlapping defects. A hotspot may be corrected by modifying the layout design before tape-out or adjusting conditions of the lithographic process during manufacturing.

Hotspot Detection Tool

Figure 3:
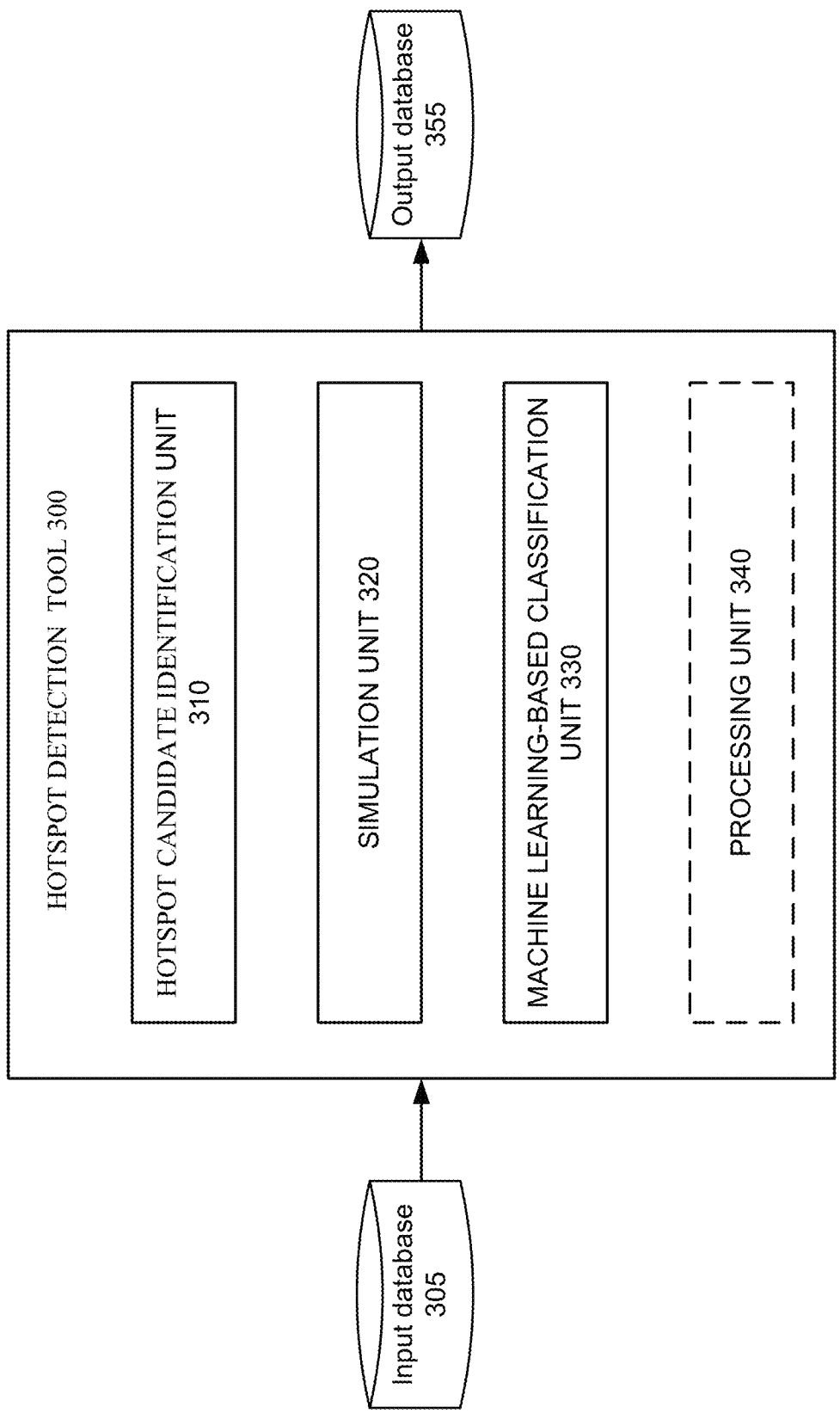
FIG. 3 illustrates an example of a hotspot detection tool according to various embodiments of the disclosed technology.

FIG. 3 illustrates an example of a hotspot detection tool 300 that may be implemented according to various embodiments of the disclosed technology. As seen in this figure, the hotspot detection tool 300 includes a hotspot candidate identification unit 310, a simulation unit 320, and a machine learning-based classification unit 330. Some implementations of the circuit design verification tool 300 may cooperate with (or incorporate) one or more of a processing unit 340, an input database 305 and an output database 355.

As will be discussed in more detail below, the hotspot detection tool 300 receives a layout design from the input database 305. The hotspot candidate identification unit 310 identifies pinching-type hotspot candidates and bridging-type hotspot candidates in the layout design based on criteria related to design rule checking. The criteria may be the minimum width/spacing or within a range from the minimum width/spacing. The simulation unit 320 performs simulation to derive aerial image intensity values for a plurality of sites on each of the pinching-type hotspot candidates and for a plurality of sites on each of the bridging-type hotspot candidates. The machine learning-based classification unit 330 then determines bridging-type hotspots in the bridging-type hotspot candidates based on one or more machine learning models for bridging-type hotspots with the input being the aerial image intensity values for the plurality of sites on each of the bridging-type hotspot candidates, and determines pinching-type hotspots in the pinching-type hotspot candidates based on one or more machine learning models for pinching-type hotspots with the input being the aerial image intensity values for the plurality of sites on each of the pinching-type hotspot candidates. The hotspot detection tool 300 stores information of the pinching-type hotspots and the bridging-type hotspots in the output database 355. The processing unit 340 may process the layout design to repair some or all of the pinching-type hotspots and the bridging-type hotspots.

As previously noted, various examples of the disclosed technology may be implemented by one or more computing systems, such as the computing system illustrated in FIGS. 1 and 2. Accordingly, one or more of the hotspot candidate identification unit 310, the simulation unit 320, the machine learning-based classification unit 330 and the processing unit 340 may be implemented by executing programming instructions on one or more processors in one or more computing systems, such as the computing system illustrated in FIGS. 1 and 2. Correspondingly, some other embodiments of the disclosed technology may be implemented by software instructions, stored on a non-transitory computer-readable medium, for instructing one or more programmable computers/computer systems to perform the functions of one or more of the hotspot candidate identification unit 310, the simulation unit 320, the machine learning-based classification unit 330 and the processing unit 340. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, or a solid state storage device.

It also should be appreciated that, while the hotspot candidate identification unit 310, the simulation unit 320, the machine learning-based classification unit 330 and the processing unit 340 are shown as separate units in FIG. 3, a single computer (or a single processor within a master computer) or a single computer system may be used to implement all of these units at different times, or components of these units at different times.

With various examples of the disclosed technology, the input database 305 and the output database 355 may be implemented using any suitable computer readable storage device. That is, either of the input database 305 and the output database 355 may be implemented using any combination of computer readable storage devices including, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable storage devices may also include magnetic cassettes, magnetic tapes, magnetic disks or other magnetic storage devices, holographic storage devices, or any other non-transitory storage medium that can be used to store desired information. While the input database 305 and the output database 355 are shown as separate units in FIG. 3, a single data storage medium may be used to implement some or all of these databases.

Hotspot Detection And Processing

Figure 4:
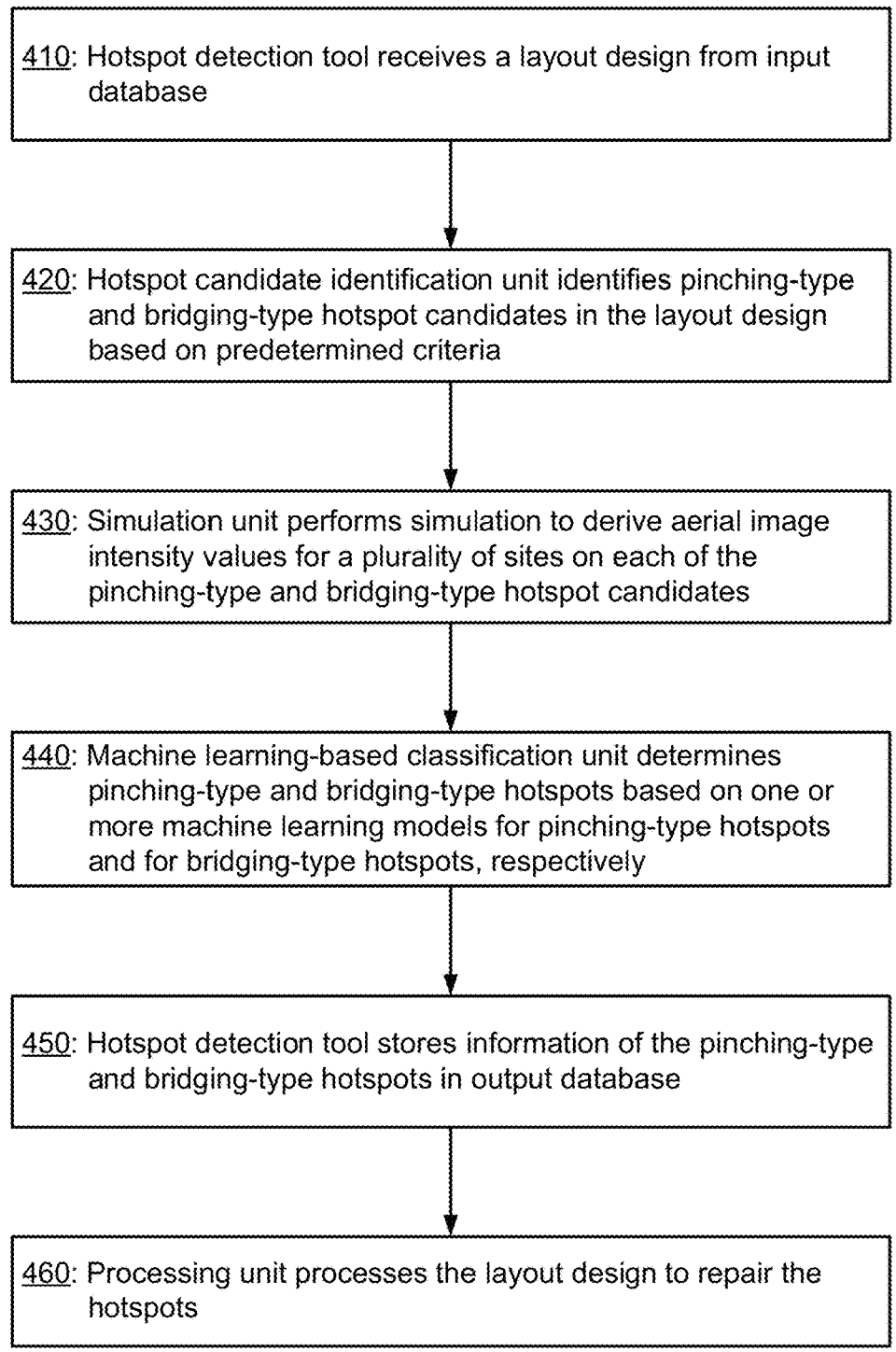
FIG. 4 illustrates a flowchart showing a process of hotspot detection and processing that may be implemented according to various examples of the disclosed technology.

FIG. 4 illustrates a flowchart 400 showing a process of hotspot detection that may be implemented according to various examples of the disclosed technology. For ease of understanding, methods of hotspot detection that may be employed according to various embodiments of the disclosed technology will be described with reference to the hotspot detection tool 300 in FIG. 3 and the flow chart 400 illustrated in FIG. 4. It should be appreciated, however, that alternate implementations of a hotspot detection tool may be used to perform the methods of hotspot detection illustrated by the flow chart 400 according to various embodiments of the disclosed technology. Likewise, the hotspot detection tool 300 may be employed to perform other methods of hotspot detection according to various embodiments of the disclosed technology.

In operation 410 of the flow chart 400, the hotspot detection tool 300 receives a layout design from the input database 305. The layout design, derived from a circuit design, may be in the GDSII standard format. The layout design can be one for a whole chip or a portion of a full-chip layout design. The layout design can be one before or after being processed by optical proximity correction.

In operation 420, the hotspot candidate identification unit 310 identifies pinching-type hotspot candidates and bridging-type hotspot candidates in the layout design based on predetermined criteria. Chip manufacturers usually define minimum spacing and linewidth requirements (rules). A design rule checking tool is usually used to analyze a layout design to search for locations violating the minimum spacing and linewidth rules. A design-rule-checking clean layout design (meeting at least the required minimum spacing and linewidth) can still have pinching-type and/or bridging-type hotspots. These hotspots most likely happen in layout patterns where spacings between layout features and linewidths of layout features are equal to or slightly greater than the minimum spacing and linewidth values, respectively. Accordingly, the hotspot candidate identification unit 310 may search for these layout patterns in the layout design as the pinching-type hotspot candidates and bridging-type hotspot candidates.

The predetermined criteria may be set as the minimum spacing and linewidth values. Any layout pattern having a layout feature spacing value equal to the minimum spacing value may be identified as one of the bridging-type hotspot candidates and any layout pattern having a layout feature linewidth value equal to the minimum spacing value may be identified as one of the pinching-type hotspot candidates. Alternatively, the predetermined criteria may be set as the minimum spacing/linewidth values plus spacing/linewidth range values. Any layout pattern having a layout feature spacing value less than the minimum spacing value plus the spacing range value is identified as one of the bridging-type hotspot candidates and any layout pattern having a layout feature linewidth value less than the minimum spacing value plus the linewidth range value is identified as one of the pinching-type hotspot candidates. The hotspot candidate identification unit 310 may employ a design rule checking tool to perform the operation.

Pinching defect may happen somewhere along a long narrow line. The hotspot candidate identification unit 310 may divide it into multiple pinching-type hotspot candidates. The spacing between neighboring pinching-type hotspot candidates may be zero or a predetermined value. For example, a spacing of 45 nm may be chosen for the 28 nm technology node and a spacing of 50 nm may be chosen for the 32 nm technology node. DRC rules, theoretical considerations or empirical considerations may also be employed by the hotspot candidate identification unit 310 to select the hotspot candidates. The hotspot candidate identification unit 310 can employ a similar method to determine bridging-type hotspot candidates from two long neighboring layout features.

In operation 430, the simulation unit 320 performs simulation to derive aerial image intensity values for a plurality of sites on each of the pinching-type hotspot candidates and for a plurality of sites on each of the bridging-type hotspot candidates. Aerial images for mask patterns (layout patterns) can then be simulated based on a mask transmittance function and an illumination and imaging system model. The simulation unit 320 may employ a commercial optical simulator, such as those found in the CALIBRE family of software tools available from Mentor Graphics Corporation, Wilsonville, Oreg., to derive the aerial image intensity values.

Figure 5:
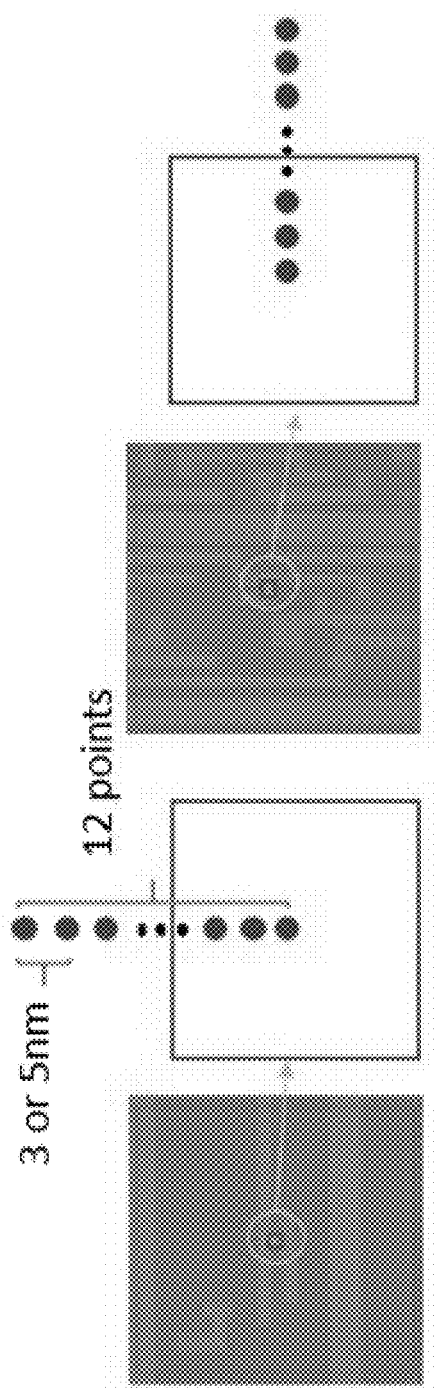
FIG. 5 illustrates two examples of aerial image intensity calculation sites for bridging-type hotspot candidates.

Rather than obtaining an aerial image for each hotspot candidate, the simulation unit 320 only computes the aerial image intensity values for a plurality of sites on it. The sampling approach can significantly reduce the computation time. According to some embodiments of the disclosed technology, the number of sites is selected in the range between eight and sixteen. For example, twelve sites may be chosen along a line with their spacing being a few nanometers. FIG. 5 illustrates two examples of aerial image intensity calculation sites for bridging-type hotspot candidates. The distance between sites is 3 nm for the 28 nm technology node and 5 nm for the 32 nm technology node.

In operation 440, the machine learning-based classification unit 330 determines pinching-type hotspots in the pinching-type hotspot candidates based on one or more machine learning models for pinching-type hotspots and bridging-type hotspots from the bridging-type hotspot candidates based on one or more machine learning models for bridging-type hotspots. The input vector for the one or more machine learning models for pinching-type hotspots is the aerial image intensity values for the plurality of sites on each of the pinching-type hotspot candidates, and the input vector for the one or more machine learning models for bridging-type hotspots is the aerial image intensity values for the plurality of sites on each of the bridging-type hotspot candidates.

Figure 6:
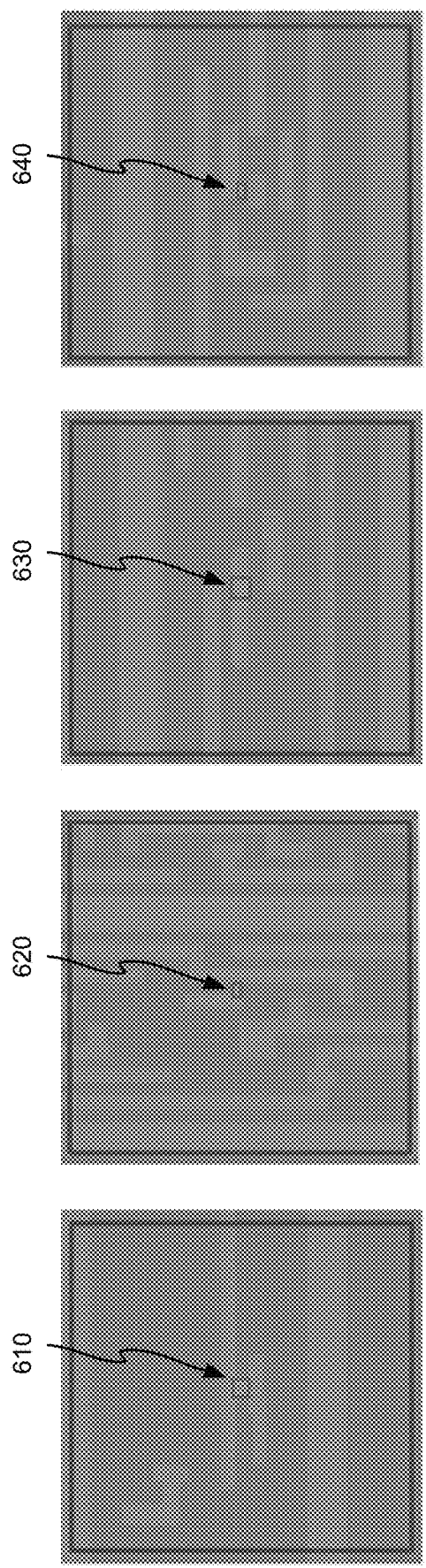
FIG. 6 illustrates an example for each of a horizontal bridging-type hotspot candidate, a vertical bridging-type hotspot candidate, a horizontal pinching-type hotspot candidate, and a vertical bridging-type hotspot candidate.
Figure 7:
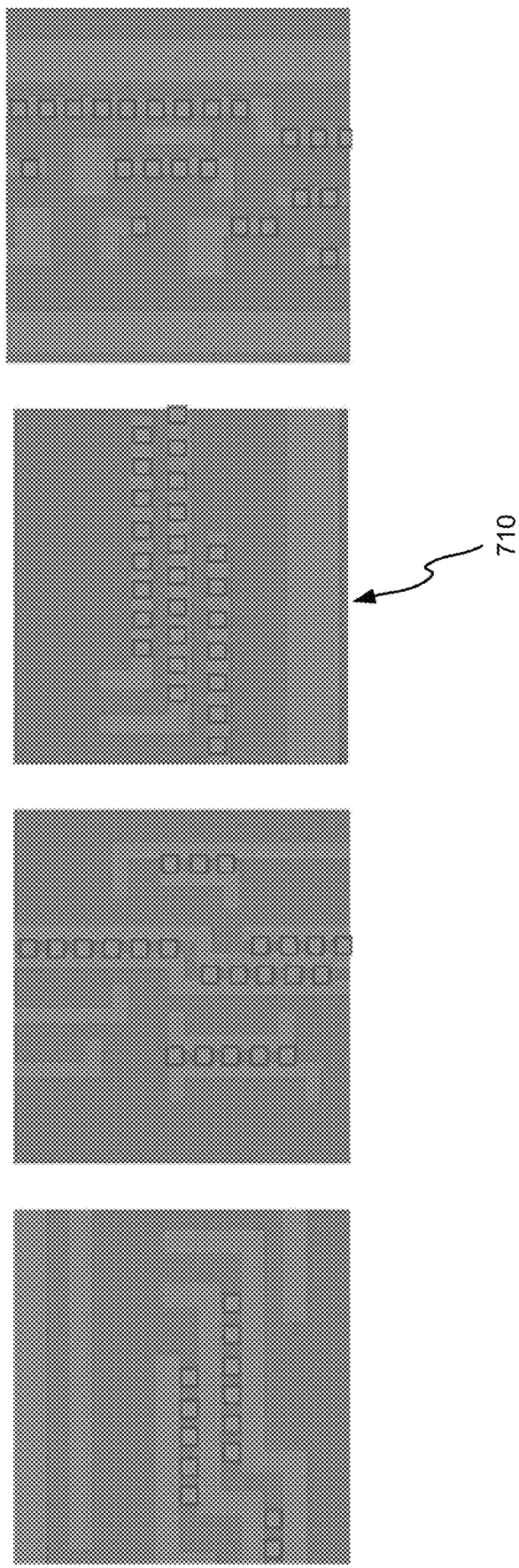
FIG. 7 four examples of layout patterns, of which each has multiple hotspot candidates.

When the lithography illumination is not symmetric (e.g., Quadruple illumination), the hotspot detection tool 300 may use a machine learning model for horizontal pinching-type hotspots, a machine learning model for vertical pinching-type hotspots, a machine learning model for horizontal bridging-type hotspots, and a machine learning model for vertical bridging-type hotspots. Correspondingly, the pinching-type hotspot candidates are separated into a group of horizontal pinching-type hotspot candidates and a group of vertical pinching-type hotspot candidates, and the bridging-type hotspot candidates are separated into a group of horizontal bridging-type hotspot candidates and a group of vertical bridging-type hotspot candidates. FIG. 6 illustrates an example of a horizontal bridging-type hotspot candidate 610, an example of a vertical bridging-type hotspot candidate 620, an example of a horizontal pinching-type hotspot candidate 630, and an example of a vertical bridging-type hotspot candidate 640. All of the hotspot candidates are in the middle of each of the layout patterns. A layout pattern can have multiple hotspot candidates. FIG. 7 illustrates four examples of layout patterns, of which each has multiple hotspot candidates. In the figure, each of the layout patterns has only the same type of the hotspot candidates. For example, a layout pattern 710 has only multiple horizontal pinching-type hotspot candidate. It should be noted, however, that a layout pattern can have different types of the hotspot candidates.

Figure 8:
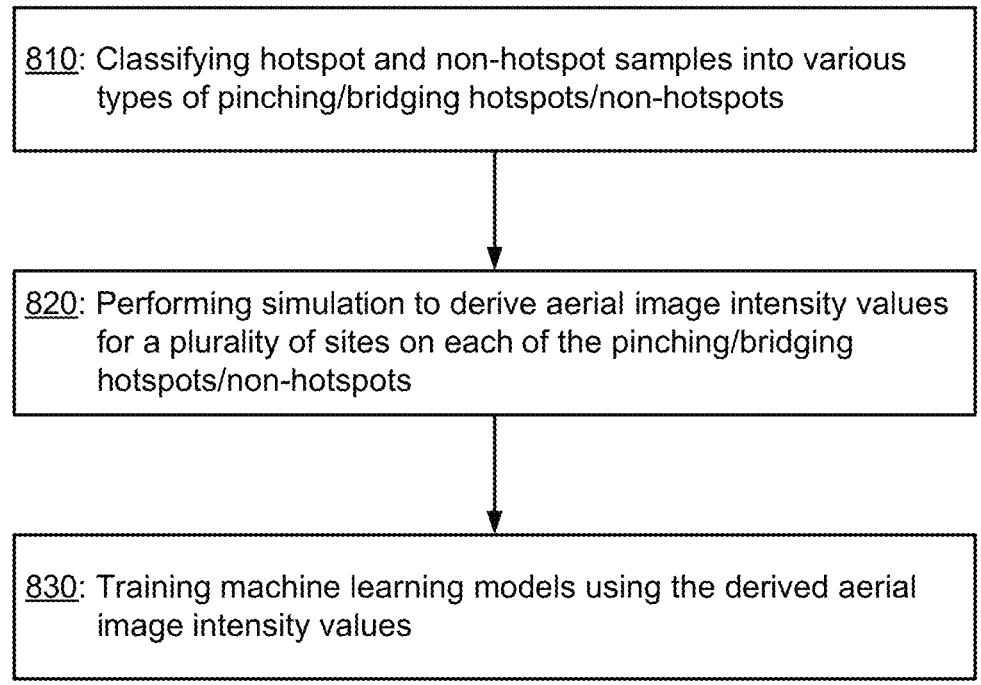
FIG. 8 illustrates a flowchart showing a process for training machine learning models for hotspot detection that may be implemented according to various examples of the disclosed technology.

The machine learning models for pinching-type hotspots and bridging-type hotspots can be trained using a training set derived from hotspot and non-hotspot samples. FIG. 8 illustrates a flowchart 800 showing a process for training machine learning models for hotspot detection that may be implemented according to various examples of the disclosed technology. In operation 810, hotspot and non-hotspot samples are classified into, for example, horizontal pinching-type hotspots/non-hotspots, vertical pinching-type hotspots/non-hotspots, horizontal bridging-type hotspots/non-hotspots, and vertical bridging-type hotspots/non-hotspots. In operation 820, optical simulation is performed to derive aerial image intensity values for a plurality of sites on each of the horizontal pinching-type hotspots/non-hotspots, the vertical pinching-type hotspots/non-hotspots, the horizontal bridging-type hotspots/non-hotspots, and the vertical bridging-type hotspots/non-hotspots. In operation 830, the derived aerial image intensity values are used as input to train the models. Two techniques may help to derive high-quality machine learning models. The first is the optical simulation employs the same optical kernels or the same simulation tool and conditions for both the training and the classification. The second is the non-hotspot samples are derived based on the same predetermined criteria for selecting the hotspot candidates.

Various machine models can be used by the machine learning-based classification unit 330. One example is C-type Support Vector Machine (SVM) which supports binary classification: hotspots and non-hotspots. Binary classification SVM transforms training data to a high-dimensional feature space and produces a decision function (classifier) to separate the data into two classes with a maximum margin. SVM has shown excellent performance in handling a small nonlinear data set for training. If the SVM kernel function is a symmetric positive semi-definite function, it is guaranteed to have a global optimum solution. A radial basis function may be selected as the SVM kernel. The C-type SVM solution to derive a decision function can be reduced to a solution of the dual form of quadratic programming, which is given as follows:

$$\max(f(\alpha)) = \sum_i^N \alpha_i - \frac{1}{2}\sum_{jk}^N \alpha_j \alpha_k y_j y_k k(x_j, x_k)$$

Subject to $0 \leq \alpha_i \leq c$ for $\forall\, i$ $$\sum_i^N \alpha_i y_i = 0$$

$$k(x_j, x_k) = e^{\frac{-\|x-x_i\|^2}{2\sigma^2}}$$

$$\alpha = (\alpha_1, \ldots, \alpha_N)^T$$

Decision function (radial basis function SVM):

$$f(x) = \sum_i^N \alpha_i \cdot y_i \cdot e^{\frac{-\|x-x_i\|^2}{2\sigma^2}} + b, \; b\text{: bias}$$

Here, N is size of training data and γ is N dimensional vector to be learnt. Given training data $x_i$, i=1, . . . N, we have a binary label function $y_i \in \{1, -1\}$, 1 for hotspot and −1 for non-hotspot. Note that Gaussian Kernel, k, is used, which is a symmetric positive semi-definite function. C controls the trade-off between classification accuracy and the norm of the decision function. The slack variable, γ which is $\frac{1}{2}\sigma^2$ portion of the Gaussian kernel, is to handle non separable data.

Setting an appropriate C and γ may be important to have a good training result. Therefore, 3-fold cross validation may be performed during iterations with different C and γ each time to pick up the best decision function for each SVM kernel. The initial value of C may be chosen as 1 and γ is 0.0001. The iteration loop is nested with these two variables. Outer loop is γ stepping 5 times previous value until γ becomes 1. Inner loop is C stepping 5 times previous value until it reaches 100,000. The cross-validation may be performed 64 times to pick the best C and γ.

Refer back to the flowchart 400. In operation 450, the hotspot detection tool 300 stores information of the pinching-type hotspots and the bridging-type hotspots in the output database 355. In operation 460, the processing unit may process the layout design to repair some or all of the pinching-type hotspots and the bridging-type hotspots. The processing comprises changing spacing/linewidth of layout features, adding layout features, removing layout features, or any combination thereof.

Figure 9:
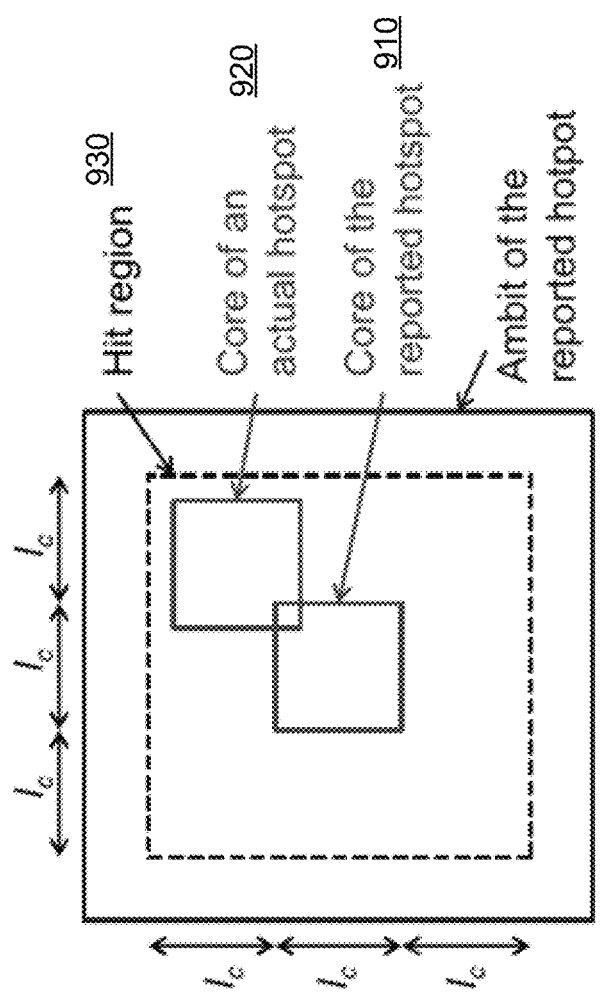
FIG. 9 illustrates an example of a "hit" by showing the relative positions of an actual hotspot and a reported hotspot.

An embodiment of the disclosed technology is tested on the testing layout designs previously used for a CAD (computer added design) contest (A. Torres, "Iccad-2012 cad contest in fuzzy pattern matching for physical verification and benchmark suite," ICCAD Special session, 2012). The embodiment of the disclosed technology uses C++ programming language and SVM library LIBSVM (C. Chang, "Libsvm: A library for support vector machines," ACM Transaction of Intelligent System and Technology (TIST), vol. 2, 2011). The contest also provided a training data set of the hotspot and non-hotspot patterns. A hit is a correctly detected hotspot (910) when core of actual hotspot (920) is inside a hit region (930) as shown in FIG. 9. Accuracy is defined as the ratio of the hits over the actual hotspots in total hotspots in total. An extra is a non-hotspot detected as a hotspot. False alarm is defined as the ratio of the extras over the testing layout area. An identified hotspot is considered as a hit when the core of the hotspot interacts with the core of an actual hotspot, which means there should be at least an overlapping area between the two cores.

Table I lists six industrial designs, two 32 nm and four 28 nm designs, which were provided by the 2012 CAD contest. In the table, "#bs" is the number of hotspots and "#nbs" is the number of non-hotspots. The chip size is 4.8×4.8 um$^2$ while the core size is 1.2×1.2 um$^2$.

TABLE I

| Training data | | | Testing layout | | | |
|---|---|---|---|---|---|---|
| Name | #hs | #nhs | Name | #hs | area (nm$^2$) | process |
| MX benchmark1 clip | 99 | 340 | Arrary benchmark1 | 226 | 12,516 | 32 nm |
| MX benchmark2 clip | 176 | 5,285 | Arrary benchmark2 | 499 | 106,954 | 28 nm |
| MX benchmark3 clip | 923 | 4,643 | Arrary benchmark3 | 1,847 | 122,565 | 28 nm |
| MX benchmark4 clip | 98 | 4,452 | Arrary benchmark4 | 192 | 82,010 | 28 nm |
| MX benchmark5 clip | 26 | 2,716 | Arrary benchmark5 | 42 | 49,583 | 28 nm |
| | | | MX blind partial | 55 | 224,975 | 32 nm |

FIG. 10 illustrates a table summarizing the results derived according to the one embodiment of the disclosed technology against the 2012 CAD contest winner and other references. In the table, the disclosed technology is labeled as "Ours", the 2012 CAD contest winners is labeled as "place" (A. Tones, "Iccad-2012 cad contest in fuzzy pattern matching for physical verification and benchmark suite." ICCAD Special session, 2012), and the other references are labeled as "[17]" (H. Zhang, "Enabling online learning in lithography hotspot detection with information-theoretic feature optimization." ICCAD, 2016, pp. 1-8), "[16]" (H. Yang, "Imbalance aware lithography hotspot detection: A deep learning approach." SPIE, 2017), "[11]" (S. Lin, "A novel fuzzy matching model for lithography hotspot detection." DAC, 2012, pp. 1-6), and "[21]" (Y.-T. Yu, "Machine-learning-based hotspot detection using topological classification and critical feature extraction," IEEE TCAD, vol. 34, pp. 460-470, 2015).

As FIG. 10 shows, the disclosed technology can achieve the highest accuracy among other previous works, ranging from 97.40% to 100% across the entire testing layouts. The accuracy is the primary criterion for a winner while the false alarm is secondary as missing one hotspot can make a design not suitable for manufacture. Even the false alarm results of the disclosed technology compares favorably with the 2012 CAD contest winner and the other cited references. Thus, the disclosed technology can minimize the tradeoff of high accuracy vs. low false alarm.

CONCLUSION

While the disclosed technology has been described with respect to specific examples including presently preferred modes of carrying out the disclosed technology, those skilled in the art will appreciate that there are numerous variations and permutations of the above described systems and techniques that fall within the spirit and scope of the disclosed technology as set forth in the appended claims. For example, while specific terminology has been employed above to refer to electronic design automation processes, it should be appreciated that various examples of the disclosed technology may be implemented using any desired combination of electronic design automation processes.

What is claimed is:

1. A method, executed by at least one processor of a computer, comprising:
   receiving a layout design;
   identifying pinching-type hotspot candidates and bridging-type hotspot candidates in the layout design based on predetermined criteria;
   performing simulation to derive aerial image intensity values for a plurality of sites on each of the pinching-type hotspot candidates and for a plurality of sites on each of the bridging-type hotspot candidates;
   determining pinching-type hotspots from the pinching-type hotspot candidates based on one or more machine learning models for pinching-type hotspots and bridging-type hotspots from the bridging-type hotspot candidates based on one or more machine learning models for bridging-type hotspots, the input for the one or more machine learning models for pinching-type hotspots being the aerial image intensity values for the plurality of sites on each of the pinching-type hotspot candidates, the input for the one or more machine learning models for bridging-type hotspots being the aerial image intensity values for the plurality of sites on each of the bridging-type hotspot candidates;
   storing information of the pinching-type hotspots and the bridging-type hotspots; and
   thereafter finalizing the layout design to repair the pinching-type hotspots and the bridging-type hotspots, and manufacturing a circuit according to the finalized layout design using a photolithographic process.

2. The method recited in claim 1, wherein the one or more machine learning models for pinching-type hotspots comprise a machine learning model for horizontal pinching-type hotspots and a machine learning model for vertical pinching-type hotspots, the one or more machine learning models for bridging-type hotspots comprise a machine learning model for horizontal bridging-type hotspots and a machine learning model for vertical bridging-type hotspots, the pinching-type hotspot candidates are separated into a group of horizontal pinching-type hotspot candidates and a group of vertical pinching-type hotspot candidates, and the bridging-type hotspot candidates are separated into a group of horizontal bridging-type hotspot candidates and a group of vertical bridging-type hotspot candidates.

3. The method recited in claim 1, wherein the predetermined criteria may be set according to design checking rules.

4. The method recited in claim 1, wherein the one or more machine learning models for pinching-type hotspots and the one or more machine learning models for bridging-type hotspots are C-type Support Vector Machine models.

5. The method recited in claim 1, wherein a number of the plurality of sites is greater than 8 and less than 20.

6. One or more non-transitory computer-readable media storing computer-executable instructions for causing one or more processors to perform a method, the method comprising:
receiving a layout design;
identifying pinching-type hotspot candidates and bridging-type hotspot candidates in the layout design based on predetermined criteria;
performing simulation to derive aerial image intensity values for a plurality of sites on each of the pinching-type hotspot candidates and for a plurality of sites on each of the bridging-type hotspot candidates;
determining pinching-type hotspots from the pinching-type hotspot candidates based on one or more machine learning models for pinching-type hotspots and bridging-type hotspots from the bridging-type hotspot candidates based on one or more machine learning models for bridging-type hotspots, the input for the one or more machine learning models for pinching-type hotspots being the aerial image intensity values for the plurality of sites on each of the pinching-type hotspot candidates, the input for the one or more machine learning models for bridging-type hotspots being the aerial image intensity values for the plurality of sites on each of the bridging-type hotspot candidates;
storing information of the pinching-type hotspots and the bridging-type hotspots; and
finalizing the layout design to repair the pinching-type hotspots and the bridging-type hotspots, wherein a circuit is thereafter manufactured according to the finalized layout design using a photolithographic process.

7. The one or more non-transitory computer-readable media recited in claim 6, wherein the one or more machine learning models for pinching-type hotspots comprise a machine learning model for horizontal pinching-type hotspots and a machine learning model for vertical pinching-type hotspots, the one or more machine learning models for bridging-type hotspots comprise a machine learning model for horizontal bridging-type hotspots and a machine learning model for vertical bridging-type hotspots, the pinching-type hotspot candidates are separated into a group of horizontal pinching-type hotspot candidates and a group of vertical pinching-type hotspot candidates, and the bridging-type hotspot candidates are separated into a group of horizontal bridging-type hotspot candidates and a group of vertical bridging-type hotspot candidates.

8. The one or more non-transitory computer-readable media recited in claim 6, wherein the predetermined criteria may be set according to design checking rules.

9. The one or more non-transitory computer-readable media recited in claim 6, wherein the one or more machine learning models for pinching-type hotspots and the one or more machine learning models for bridging-type hotspots are C-type Support Vector Machine models.

10. The one or more non-transitory computer-readable media recited in claim 6, wherein a number of the plurality of sites is greater than 8 and less than 20.

11. A system, comprising:
one or more processors, the one or more processors programmed to perform a method, the method comprising:
receiving a layout design;
identifying pinching-type hotspot candidates and bridging-type hotspot candidates in the layout design based on predetermined criteria;
performing simulation to derive aerial image intensity values for a plurality of sites on each of the pinching-type hotspot candidates and for a plurality of sites on each of the bridging-type hotspot candidates;
determining pinching-type hotspots from the pinching-type hotspot candidates based on one or more machine learning models for pinching-type hotspots and bridging-type hotspots from the bridging-type hotspot candidates based on one or more machine learning models for bridging-type hotspots, the input for the one or more machine learning models for pinching-type hotspots being the aerial image intensity values for the plurality of sites on each of the pinching-type hotspot candidates, the input for the one or more machine learning models for bridging-type hotspots being the aerial image intensity values for the plurality of sites on each of the bridging-type hotspot candidates;
storing information of the pinching-type hotspots and the bridging-type hotspots; and
finalizing the layout design to repair the pinching-type hotspots and the bridging-type hotspots, wherein a circuit is thereafter manufactured according to the finalized layout design using a photolithographic process.

12. The system recited in claim 11, wherein the one or more machine learning models for pinching-type hotspots comprise a machine learning model for horizontal pinching-type hotspots and a machine learning model for vertical pinching-type hotspots, the one or more machine learning models for bridging-type hotspots comprise a machine learning model for horizontal bridging-type hotspots and a machine learning model for vertical bridging-type hotspots, the pinching-type hotspot candidates are separated into a group of horizontal pinching-type hotspot candidates and a group of vertical pinching-type hotspot candidates, and the bridging-type hotspot candidates are separated into a group of horizontal bridging-type hotspot candidates and a group of vertical bridging-type hotspot candidates.

13. The system recited in claim 11, wherein the predetermined criteria may be set according to design checking rules.

14. The system recited in claim 11, wherein the one or more machine learning models for pinching-type hotspots and the one or more machine learning models for bridging-type hotspots are C-type Support Vector Machine models.

15. The system recited in claim 11, wherein a number of the plurality of sites is greater than 8 and less than 20.

* * * * *